(12) United States Patent
Sherif et al.

(10) Patent No.: US 6,350,944 B1
(45) Date of Patent: Feb. 26, 2002

(54) SOLAR MODULE ARRAY WITH RECONFIGURABLE TILE

(75) Inventors: Raed A. Sherif, Woodland Hills; Karim S. Boutros, Moorpark, both of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/580,286

(22) Filed: May 30, 2000

(51) Int. Cl.[7] .............................................. H01L 31/042
(52) U.S. Cl. ........................ 136/244; 136/292; 136/293; 323/906; 323/271; 307/71
(58) Field of Search .................................. 136/244, 292, 136/293; 323/906, 271; 307/71

(56) References Cited

U.S. PATENT DOCUMENTS

| | | | |
|---|---|---|---|
| 3,636,539 A | * 1/1972 | Gaddy et al. | 136/293 |
| 4,019,924 A | 4/1977 | Kurth | 136/251 |
| 4,175,249 A | * 11/1979 | Gruber | 136/293 |
| 5,021,099 A | 6/1991 | Kim et al. | 136/249 |
| 5,185,042 A | 2/1993 | Ferguson | 136/244 |
| 5,453,729 A | * 9/1995 | Chu | 340/322 |
| 5,460,659 A | 10/1995 | Krut | 136/246 |
| 5,466,302 A | 11/1995 | Carey et al. | 136/251 |
| 5,500,052 A | * 3/1996 | Horiuchi et al. | 136/244 |
| 5,644,207 A | * 7/1997 | Lew et al. | 320/101 |
| 6,060,790 A | * 5/2000 | Craig, Jr. | 307/71 |

* cited by examiner

*Primary Examiner*—Alan Diamond
(74) *Attorney, Agent, or Firm*—Terje Gudmestad

(57) ABSTRACT

A reconfigurable solar panel system having a plurality of solar cells arranged in a predefined pattern on a printed circuit board having a predefined pattern of interconnection paths to form at least one solar cell module. The solar panel being made of at least one solar cell module and having the capability to be configured and reconfigured by programming at least one integrated circuit that communicates with each and every solar cell on the solar module. The present invention is capable of monitoring, controlling, and protecting the solar panel, as well as being reconfigured before, during and after the panel is assembled. With the present invention it is also possible to reconfigure the solar panel after it has been employed in an application, such as a satellite that is in orbit.

14 Claims, 2 Drawing Sheets

SOLAR MODULE ARRAY WITH RECONFIGURABLE TILE

TECHNICAL FIELD

The present invention relates to a solar cell assembly and more particularly to a reconfigurable solar cell assembly.

BACKGROUND ART

Solar cells are an important source of power, particularly in space applications. Typically, a plurality of cells are supported on a substrate and electrically interconnected in a fixed pattern. The substrate may be rigid or flexible.

The fixed pattern typically requires hard wired interconnects between solar cells on a solar cell assembly. Generally, a solar cell array will be mounted to a printed circuit board, and the individual solar cells will be wired together in a fixed pattern on the printed circuit board that is pre-defined before the solar panel assembly, by the specific application the solar cell array is designed for. There are many known methods of packaging and mounting solar cells to a printed circuit board. However, the solar cell array is designed and manufactured for specific applications and typically the array has limited flexibility. It is difficult, if not impossible, to change the specifications of prior art solar cell arrays once the array has been assembled.

SUMMARY OF THE INVENTION

The present invention is a reconfigurable solar cell panel having a system of integrated solar-power generation cells with monitoring control and reconfiguration circuitry in a modular array scheme. The present invention is capable of being manufactured using automated processes having a standardized module configuration to simplify the manufacturing process. Continuous monitoring and control of each and every solar cell on a module is possible. It is also possible to control and monitor a group of solar cells assembled in a string. The individual modules can be assembled onto solar panels, and independently configured and reconfigured, in both their current and voltage options, according to the specifications of the panel, the payload, and the spacecraft. According to the present invention, the modifications can be made either at the time of assembly, or after assembly, and even when the spacecraft is in orbit.

In the present invention, a plurality of solar cells are packaged on a printed circuit board to form a solar module, also known as a solar module array reconfigurable tile (SMART) module. A solar panel is made up of a plurality of modules that are electrically connected together. The connections between the solar modules can be made with stress relief loops to absorb any thermal expansion mismatch stresses. The solar cells are connected to the printed circuit board medium using any known techniques currently practiced in the industry, for example, as by soldering or using conductive epoxy.

The printed circuit board is the physical support structure for the array of solar cells and provides the electrical connection paths between the solar cells comprising the solar cell module. Each solar cell on the module is part of a matrix of solar cells. A plurality of modules is assembled into a solar panel.

Each solar cell is uniquely addressable and controllable through the control circuitry and an integrated circuit. The integrated circuit can be employed in a variety of methods in order to control the solar cell array. For example, the programmable integrated circuit chip, which performs the monitoring, control, and reconfiguration of the solar cell module, may be located on the printed circuit board for each solar cell array. In other words, there is one integrated circuit for an entire module. The integrated circuits on each module can communicate with integrated circuits on other modules to enable a re-configurable solar panel that is made up of a plurality of solar modules. Yet another alternative would be to have one integrated circuit that acts as a master control module and controls the entire solar panel.

It is an object of the present invention to provide a solar-power generation system that is modular, versatile and easily manufactured as an interchangeable core unit. It is another object of the present invention to allow for optimization and modification of the electrical configuration of a module of solar cells either before being mounted onto a spacecraft, or being remotely accessed for reconfiguration after the spacecraft is in orbit.

It is a further object of the present invention to simplify the design of solar modules by providing a standardized layout that achieves different electrical configurations by way of integrated circuit control of individual modules and even individual solar cells.

It is yet a further object of the present invention to monitor and control the operation of solar cells such that a group of solar cells may be shunted out when so desired, and activated only when excess power is needed, as for example, at the end of the solar cell's life.

Other objects and features of the present invention will become apparent when viewed in light of the detailed description of the preferred embodiment when taken in conjunction with the attached drawings and appended claims.

BEST MODE(S) FOR CARRYING OUT THE INVENTION

Figure 1:
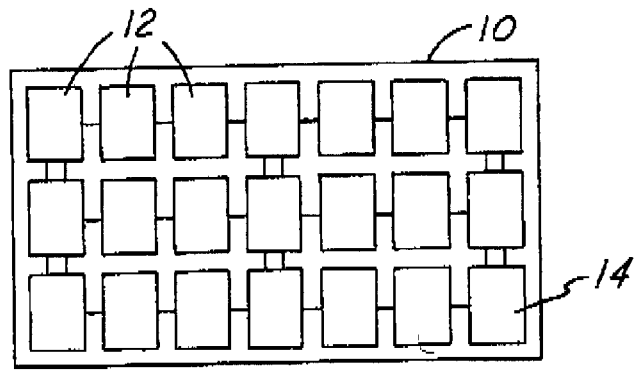
FIG. 1 is a schematic representation of a solar power generation panel having a plurality of solar modules and an integrated circuit chip.
Figure 2:
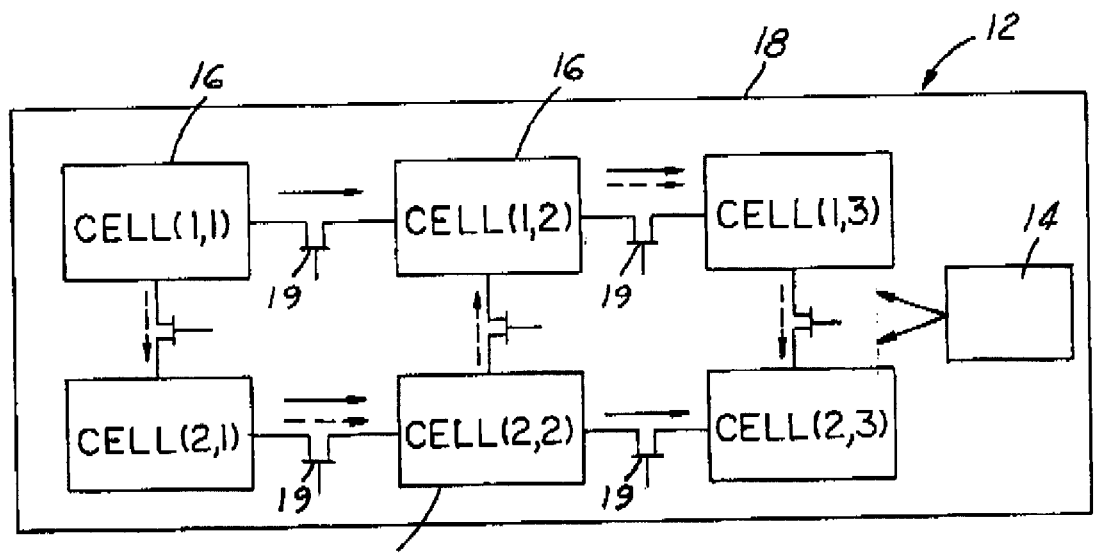
FIG. 2 is a schematic representation of an example reconfiguration scheme for a module of the present invention having an array of solar cells.
Figure 3:
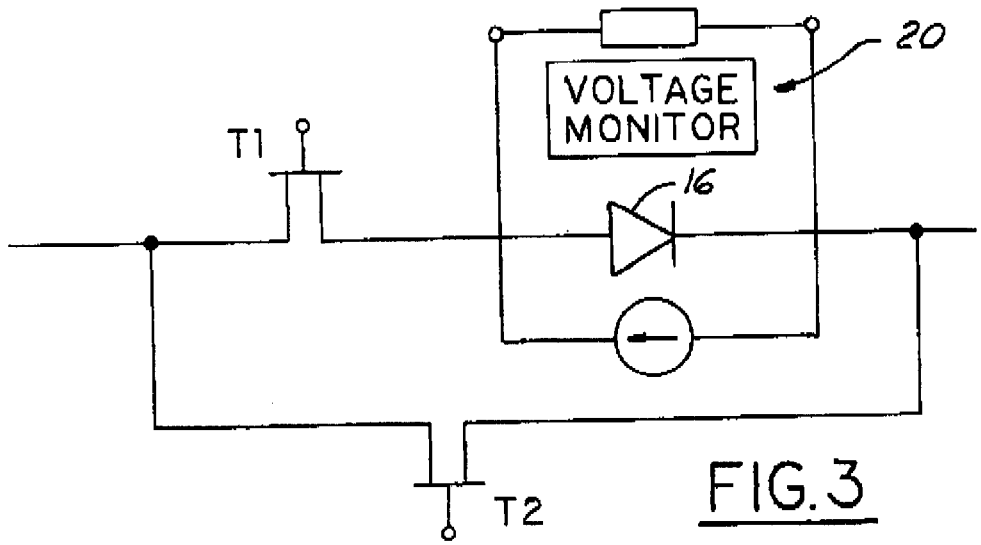
FIG. 3 is an electrical circuit representing the function of the integrated circuit control, monitoring and protection of the solar cells in a module.

The present invention is a reconfigurable solar cell array in which a plurality of solar cells, arranged in an array, are mounted on a printed circuit board to create a solar module. Several solar modules can be arranged and interconnected to create a solar panel. At least one integrated circuit is used to address, configure, and control the solar cell arrays and the solar modules. FIGS. 1–3 generally depict the present invention.

FIG. 1 is a schematic diagram of a solar-power generation panel 10 in which a plurality of solar modules 12 are arranged and mounted to the panel 10. An integrated circuit chip 14 acts as a master module controller. The integrated circuit chip 14 is used to configure, interconnect and control the solar modules 12 as desired.

Each solar module 12 is a stand-alone unit that can be monitored and controlled by the integrated circuit chip 14.

The modules 12 can be assembled in a variety of series and parallel strings on the solar panel 10. The integrated circuit chip 14 is capable of being programmed to monitor the modules 12, regulate power, and control the individual modules 14 in the array. Additionally, the integrated circuit chip 14 can be programmed to define the interconnections between modules 12 according to the solar panel 10 system design.

Referring now to FIG. 2, there is shown an individual module 12 in greater detail. Each module 12 contains a plurality of solar cells 16 mounted on a printed circuit board 18. All of the internal wiring of the module 12 is contained within the printed circuit board 18. The printed circuit board 18 has the solar cells 16 mounted thereto in an array and contains all of the interconnects and circuitry associated therewith, which would otherwise be difficult to implement using conventional hard wiring techniques.

The printed circuit board 18 allows for easy manufacturing of the complicated array of solar cells 16. The circuitry is predetermined in the printed circuit board 18 and several path options are available between solar cells 16 on the module 12. The paths to be used in the module's construction 12 are determined by the function that the module 12 is to perform.

The printed circuit board 18 can be either a rigid or flexible material. Typically, the substrate of a solar panel has a honeycomb structure. In the event the printed circuit board is rigid, the thickness of the honeycomb substrate may be reduced to compensate for the extra weight associated with the rigid printed circuit board. Because the rigidity of the printed circuit board provides increased stability to the structure, it is possible to reduce the thickness of the honeycomb substrate without adversely affecting the structure of the solar panel.

In the event the printed circuit board is a flexible material, i.e. a thin sheet, it is possible to mount the printed circuit board directly to the honeycomb structure of the panel before mounting the individual solar cells 16 to the printed circuit board 18. This sequence of assembly is to make it easier to handle the printed circuit board material, i.e. without the added solar cells the flexible sheet is easier to handle during assembly of the solar panel. Alternatively, the solar cells could be mounted to the flexible printed circuit board, and then each printed circuit board is attached to the honeycomb substrate.

In the preferred embodiment, there is a standard configuration for the printed circuit board 18 for each module 12, which includes the layout and interconnection path options for all of the solar cells 16 within the module 12. The standard configuration makes mounting and testing of each of the plurality of solar cells 16 relatively easy. It is also convenient to identify and replace defective cells prior to mounting the module 12 onto a solar panel.

The program in the integrated circuit chip 14 generates the configuration of the interconnection scheme for the solar cells 16. The module 12 allows each cell to be individually addressable using a matrix-labeling scheme, which specifies the cell location on the module 12. FIG. 2 is an example of a simplified array of solar cells 16 having a matrix addressing system. The cells are labeled according to their row and column location. For example, in the first row, there are three columns and the cells 16 are labeled Cell(1,1), Cell(1,2) and Cell(1,3) respectively. Likewise in the second row, there are three columns and the cells 16 are labeled Cell(2,1), Cell(2,2) and Cell(2,3). While only two rows and three columns are shown in the present example, it is to be understood that the number of cells is not limited. One skilled in the art is capable of expanding on what is shown in FIG. 2 to accomplish a much larger array of solar cells 16.

The integrated circuit chip 14 is shown on the module 12. It should be noted that there are several methods of employing the integrated circuit chip 14. For example, it is possible that each module 12 has an individual integrated circuit chip 14 to control the solar cells 16 for that particular module 12. In this embodiment, it is possible that all of the integrated circuit chips on the solar panel can communicate with each other in order to control the overall panel. Another alternative may be that, in addition to each of the integrated circuits located on the modules, a master integrated circuit is located on the panel to communicate with each module's integrated circuit. Yet another alternative may have only one integrated circuit chip 14 for the entire system located on the solar panel that has the capability of addressing each solar cell on each module in the desired fashion. In any event, one of ordinary skill in the art is capable of designing many possible arrangements for the integrated circuit and how it communicates with the modules and the solar cells.

Also shown in FIG. 2 is a possible interconnection scheme between the individual solar cells 16 on the module 12. A network of transistors 19 connects the solar cells 16 to each other. While transistors 19 are shown, it should be noted that other switching devices may be used to achieve the signal routing scheme desired. The network of transistors 19 allows the interconnection paths to be switched between solar cells 16. The integrated circuit 14 can be programmed to open or close the switching transistors 19 between cells in order to connect, or disconnect a path therebetween. In this regard, the desired interconnection paths can be created.

In the present invention, the interconnection paths are switchable. Therefore, it is possible to change the path at any time by altering the program in the integrated circuit chip 14. Any changes can be made before, during, or after assembly and even remotely while the solar panel is in orbit. The flexibility provided by the present invention is especially advantageous in situations in which the use of a solar panel requires changes to its output requirements while the spacecraft is in orbit. With the present invention it is possible to alter the output current and voltage of each module, and ultimately of the solar panel in total.

Another advantage of the present invention is that each solar cell can be monitored individually. In the event of a failure, the reconfigurable module allows for the interconnection paths to be rerouted in order to avoid the failed solar cell. The reconfigurable design of the present invention allows for optimization and modification of the electrical configuration of the module, even after the module is physically assembled, and even after the spacecraft is in orbit.

FIG. 3 is an example of an electrical circuit that describes the function of the control integrated circuit chip 14 and how it provides monitoring, protection, and control of the solar cells in each module. All of the circuit components necessary to perform these functions can be placed on the integrated circuit chip 14.

Monitoring of each cell is achieved using a voltage monitoring circuit 20 as shown in FIG. 3. The voltage monitor 20 allows the control integrated circuit chip (not shown) to determine the functional state of the cell 16. The chip can determine whether the cell 16 is optimally functional, functional but with degraded performance, or not functional. Based on the state of the cell 16, the integrated circuit chip can determine if it should keep the cell use, or bypass the cell from the power generation system, and whether or not to reconfigure the cell string configuration.

In the example shown in FIG. 3, the transistors T1 and T2 are used to enable, disable, and reroute the signal paths to the cell 16. For example, if the cell 16 is functional, T1 is enabled and T2 is disabled. To bypass the cell 16, T2 is enabled and T1 is disabled.

The bypass scheme discussed above can also be used protect the cell 16. For example, it is possible to use the reconfiguration capability in order to prevent a reverse-bias condition, which may damage the solar cell 16. Reverse-bias is an undesirable condition that may occur due to partial shadowing of the solar panel.

Figure 4:
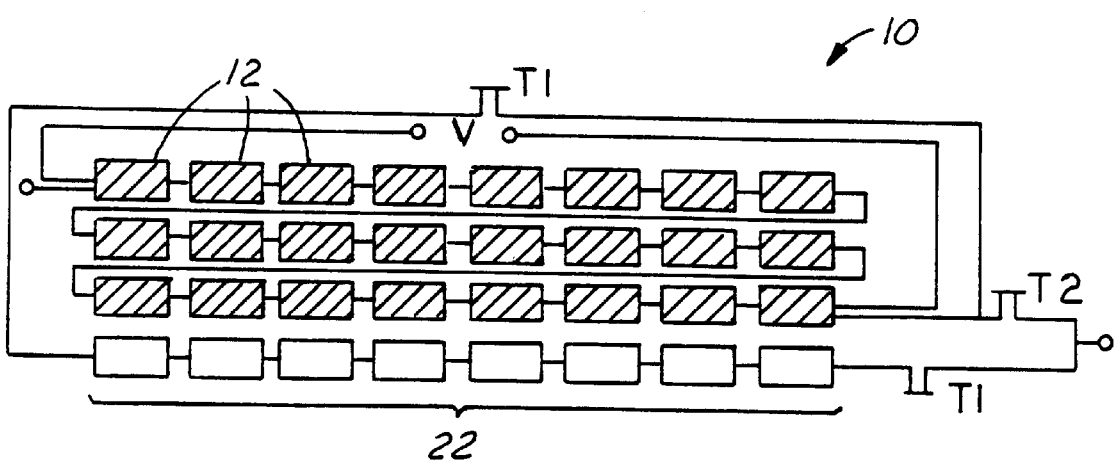
FIG. 4 is an electrical circuit representing a group of solar cells that can be activated only when excess power is needed.

FIG. 4 is a schematic of a group of solar cells having a reserve group 22 that is activated only when excess power is needed. In FIG. 4, the panel 10 has modules 12 arranged in a predefined pattern. A predetermined number of modules 12 form a reserve group 22 that is reserved for excess power demands. A transistor T1 is turned off and a transistor T2 is turned on. A voltage monitor 20 is used to compare the output voltage of the panel to a predetermined value. The comparison is used to decide when to activate the reserve group 22.

It should be noted that while T1 is shown in two places in FIG. 4, it is the same transistor. The connection as indicated in FIG. 4 is possible when all of the transistors are located on one integrated circuit chip. However, one skilled in the art is capable of accomplishing the same results with discrete components as well.

The embodiment shown in FIG. 4 avoids generating excess power at the beginning of the panel's life and reserves the power available in the reserve group 22 for the additional power and voltage that is typically required at the end of the panel's life. An advantage of this embodiment is that there is no need to dissipate excess energy typically generated at the beginning of the panel's life. The excess energy is typically dissipated at the satellite as excess heat. By avoiding the need to dissipate excess energy, the surface area of the satellite's heat dissipating surface can be reduced, thereby resulting in a weight reduction as well.

The modularized design of the present invention provides a solar panel system that is versatile and easily manufactured. The present invention allows for optimization of the electrical configuration of the module at any point during the module's construction and use. Prior art methods rely on hard-wired configuration, which can only be modified by altering the physical wiring scheme. The present invention has a standard physical layout and the different electrical configurations are achieved by way of electrical routing of strings of cells rather than hard-wired modifications.

Therefore, the present invention is extremely flexible and capable of accommodating different power generation requirements and specifications.

Additionally, manufacturing of the present invention is simplified over prior art assemblies. The standard physical layout can be mass-produced, as opposed to having to produce a panel that is specifically manufactured for a particular application on a spacecraft. With the modular design of the present invention, automation in assembly and testing can be realized. These advantages result in significant manufacturing cost reductions.

The modularity of the standardized design according to the present invention, allows for individual testing, assembly, and reconfiguration of each module prior to mounting the modules to the panel, and even thereafter. Another advantage of the modularity is the capability of the present invention to control and monitor each solar cell individually, using a centralized integrated circuit chip. This eliminates redundancy in the circuit and reduces the cost associated with duplicate circuits.

While particular embodiments of the present invention have been shown and described, numerous variations and alternate embodiments will occur to those skilled in the art. Accordingly, it is intended that the invention be limited only in terms of the appended claims.

What is claimed is:

1. A modular solar panel system comprising:
   at least one solar cell module comprising:
      a printed circuit board medium having a pattern of interconnecting path options;
      a plurality of solar cells arranged in a matrix on said printed circuit board medium;
      at least one integrated circuit having a program defining a reconfigurable sub-pattern from said pattern of interconnecting path options, said plurality of solar cells being connected by said reconfigurable sub-pattern; and
      an integrated circuit located on said solar panel system being in communication with each of said at least one integrated circuits located on each of said at least one solar cell module.

2. The system as claimed in claim 1 wherein said printed circuit board medium is made of a rigid material.

3. The system as claimed in claim 1 wherein said printed circuit board medium is made of a flexible material.

4. The system as claimed in claim 1 wherein said plurality of solar cells further comprises a number of solar cells being reserved for providing excess power to said solar panel system.

5. The system as claimed in claim 4 wherein said system has a threshold voltage output and wherein said system further comprises a voltage monitor for comparing said threshold voltage output to an actual voltage output and wherein said reserved solar cells are activated when said actual voltage output is less than said threshold voltage output.

6. A method for reconfiguring a solar panel system having at least one solar cell module having a plurality of solar cells mounted on a printed circuit board having a pattern of interconnecting path options for connecting said plurality of solar cells, said method comprising the steps of:
   programming at least one integrated circuit chip having the capability of addressing each solar cell in said plurality of solar cells to define a signal route from said pattern of interconnecting path options and defining a power output and a current output for said solar panel system;

programming an integrated circuit chip on each of said at least one solar cell module; and programming said at least one integrated circuit chip to communicate with each said integrated circuit chip on each of said at least one solar cell module.

7. The method as claimed in claim 6 further comprising the step of monitoring each of said plurality of solar cells.

8. The method as claimed in claim 7 wherein the step of monitoring further comprises:

determining a functional state of at least one solar cell in said plurality of solar cells; and determining an operation for said at least one solar cell based on said functional state of said solar cell.

9. The method as claimed in claim 8 wherein said step of determining a functional state of at least one solar cell further comprises using a voltage monitoring circuit.

10. The method as claimed in claim 6 further comprising the step of regulating the power of said solar panel system.

11. The method as claimed in claim 6 further comprising the step of protecting said solar panel system.

12. The method as claimed in claim 11 wherein said step of protecting said solar panel system further comprises the step of bypassing a solar cell that is operating in an undesirable state.

13. The method as claimed in claim 6 wherein said step of programming further comprises programming by remotely accessing said solar panel system.

14. A method for controlling a voltage output of a solar panel having at least one solar cell module having a plurality of solar cells mounted on a printed circuit board having a pattern of interconnection path options for connecting said plurality of solar cells, said plurality of solar cells having a number of solar cells as a reserve number, said method comprising the steps of:

programming at least one integrated circuit chip having the capability of addressing each solar cell in said plurality of solar cells to define a signal path routed from said pattern of interconnection path options and defining a power output and a current output for said solar panel;

comparing a threshold voltage output to an actual voltage output to determine if said actual voltage output is less than said threshold voltage output; and activating said reserve number of solar cells to provide excess power to said solar panel when said actual voltage output is less than said threshold voltage output.

* * * * *